(12) United States Patent
Yoon (10) Patent No.: US 9,041,048 B2
(45) Date of Patent: May 26, 2015

(54) SEMICONDUCTOR LIGHT EMITTING DEVICE

(75) Inventor: Ho Sang Yoon, Gwangju (KR)

(73) Assignee: LG INNOTEK CO., LTD., Seoul (KR)

( * ) Notice: Subject to any disclaimer, the term of this patent is extended or adjusted under 35 U.S.C. 154(b) by 475 days.

(21) Appl. No.: 12/552,648

(22) Filed: Sep. 2, 2009

(65) Prior Publication Data

US 2010/0052010 A1 Mar. 4, 2010

(30) Foreign Application Priority Data

Sep. 2, 2008 (KR) .................. 10-2008-0086320

(51) Int. Cl.
  *H01L 33/00* (2010.01)
  *H01L 33/14* (2010.01)
  *H01L 33/02* (2010.01)

(52) U.S. Cl.
  CPC ............... *H01L 33/14* (2013.01); *H01L 33/025* (2013.01)

(58) Field of Classification Search
  CPC ........................................................ H01L 33/14
  USPC .................................. 257/101, 103, E33.002
  See application file for complete search history.

(56) References Cited

U.S. PATENT DOCUMENTS

2006/0261353 A1* 11/2006 Bandoh .......................... 257/79

FOREIGN PATENT DOCUMENTS

JP  2006-313771 A  11/2006

* cited by examiner

*Primary Examiner* — Hsin-Yi Hsieh
(74) *Attorney, Agent, or Firm* — Birch, Stewart, Kolasch & Birch, LLP (57) ABSTRACT

The semiconductor light emitting device according to embodiments has a first conductive type semiconductor layer, an un-doped semiconductor layer under the first conductive type semiconductor layer, and a plurality of semiconductor structures in the un-doped semiconductor layer.

16 Claims, 4 Drawing Sheets

SEMICONDUCTOR LIGHT EMITTING DEVICE

CROSS-REFERENCE TO RELATED APPLICATIONS

The present application claims priority under 35 U.S.C. 119 to Korean Patent Application No. 10-2008-0086320 (filed on Sep. 2, 2008), which is hereby incorporated by reference in its entirety.

BACKGROUND

Embodiments relate to a semiconductor light emitting device.

An III-V group nitride semiconductor has been variously applied as an optical device including blue/green light emitting diode (LED), high-speed switching devices such as a metal semiconductor field effect transistor (MOSFET), a hetero junction field effect transistor (HEMT), etc., and a light source of lighting and a display apparatus, etc. In particular, a light emitting device using the III group nitride semiconductor can implement a high efficiency light emission, having a direct transition type band gap that correspond to the region from visible rays to ultraviolet rays.

The nitride semiconductor has been mainly used as a light emitting diode (LED) or a laser diode (LD), and studies for improving a manufacturing process or optical efficiency have been continued.

SUMMARY

Embodiments provide a semiconductor light emitting device that comprises diffusion structures under a light emitting structure or a first conductive type semiconductor layer.

Embodiments provide a semiconductor light emitting device with reinforced ESD (electrostatic discharging) immunity by disposing a plurality of diffusion semiconductor structures in an un-doped semiconductor layer disposed under a light emitting structure.

Embodiments provide a semiconductor light emitting device that can induce three-dimensional current diffusion by disposing diffusion structures in a three-dimensional shape under a light emitting structure.

An embodiment provides a semiconductor light emitting device comprising: a first conductive type semiconductor layer; an un-doped semiconductor layer under the first conductive type semiconductor layer; and a plurality of diffusion semiconductor structure in the un-doped semiconductor layer.

An embodiment provides a semiconductor light emitting device comprising: a substrate; a first un-doped semiconductor layer that comprising a plurality of structure holes on the substrate; a plurality of diffusion semiconductor structures in the structure holes of the first un-doped semiconductor layer; a second un-doped semiconductor layer on the first un-doped semiconductor layer and the diffusion semiconductor structures; and a light emitting structures comprising a plurality of compound semiconductor layers on the second un-doped semiconductor layer.

An embodiment provides a semiconductor light emitting device comprising: a first un-doped semiconductor layer comprising a plurality of structure holes; a plurality of diffusion semiconductor structures in the structure holes of the first un-doped semiconductor layer; a second un-doped semiconductor layer on the first un-doped semiconductor layer and the diffusion semiconductor structures; a first conductive type semiconductor layer on the second un-doped semiconductor layer; an active layer on the first conductive type semiconductor layer; a second conductive type semiconductor layer on the active layer; and a second electrode portions on the second conductive type semiconductor layer.

The details of one or more embodiments are set forth in the accompanying drawings and the description below. Other features will be apparent from the description and drawings, and from the claims.

DETAILED DESCRIPTION OF THE EMBODIMENTS

Hereinafter, a semiconductor light emitting device according to embodiments will be described with reference to the accompanying drawings. Hereinafter, when explaining embodiments, the reference referred to as being on or under each layer may be explained with reference to the drawings, and the thickness of each layer is also explained by way of example, but it not limited to the thickness shown in the drawings.

In the description of embodiments, when each layer (film), region, pattern or structures are referred to as being "on" or "under" substrate, each layer (film), region, pad or pattern, being "on" and "under" include meanings of "directly" and "indirectly".

Figure 1:
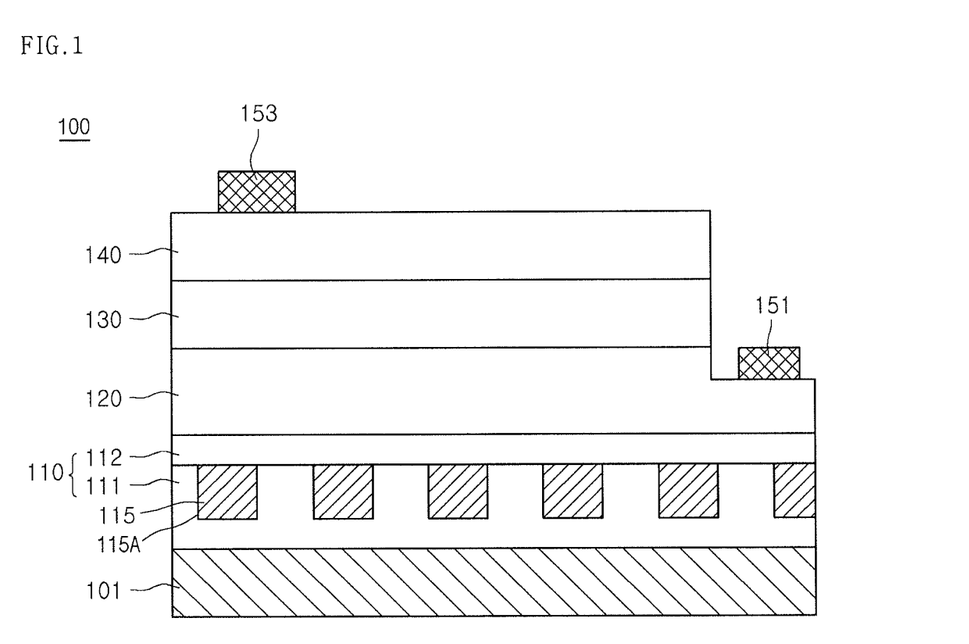
FIG. 1 is a side cross-sectional view showing a semiconductor light emitting device according to embodiments.
Figure 2:
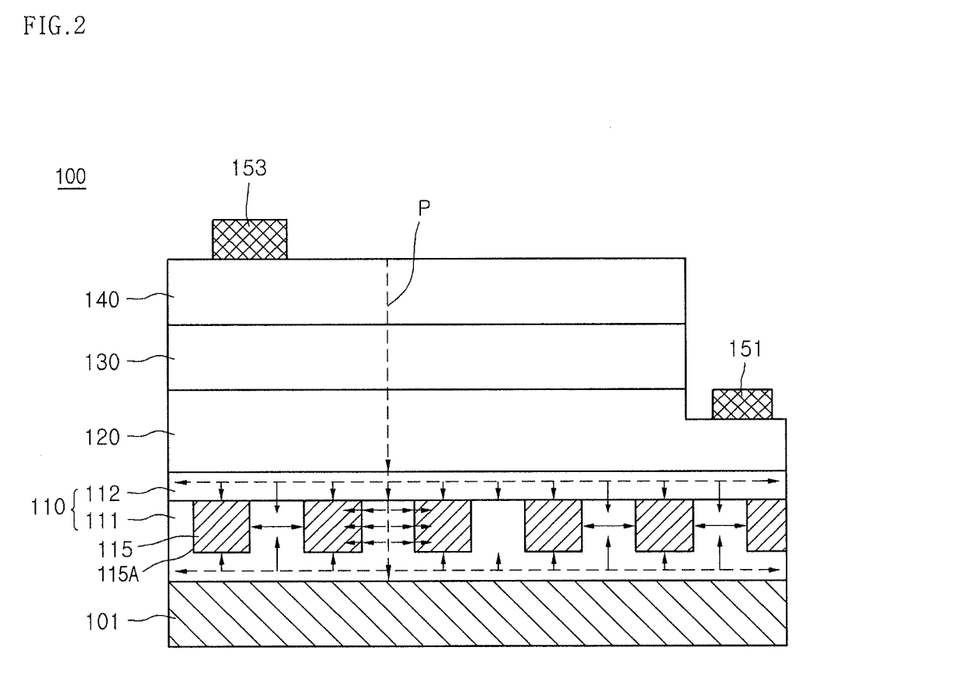
FIG. 2 is a diagram showing an example of current diffusion according to the diffusion semiconductor structures of FIG. 1.

FIG. 1 is a side cross-sectional view showing a semiconductor light emitting device according to embodiments, and FIG. 2 is a diagram showing an example of current diffusion according to the diffusion semiconductor structures of FIG. 1.

Referring to FIG. 1, the semiconductor light emitting device 100 comprises a substrate 101, an un-doped semiconductor layer 110 that comprises diffusion semiconductor structures 115, a first conductive type semiconductor layer 120, an active layer 130, and a second conductive type semiconductor layer 140.

The substrate 101 may be selected from sapphire ($Al_2O_3$), SiC, Si, GaAs, GaN, ZnO, Si, GaP, InP, Ge, and a conductive substrate. A convex and concave pattern may be formed on and/or under the substrate 101, wherein the convex pattern may comprises any one of a stripe shape, a lens shape, a pillar shape, a prism shape, and a cone shape.

A II to VI group compound semiconductor (e.g.: ZnO, etc.) may be formed on the substrate 101 in a layer shape or in a plural pattern shape.

A buffer layer (not shown) may be formed on the substrate 101, wherein the buffer layer may relieve the lattice mismatch between GaN material and the substrate material. The material of the buffer layer may be selected from III-V group compound semiconductors, for example, GaN, AlN, AlGaN, InGaN, InN, InAlGaN, AlInN, AlGaAs, GaP, GaAs, GaAsP, AlGaInP, etc.

An un-doped semiconductor layer 110 may be formed on the substrate 101 or the buffer layer. The un-doped semiconductor layer 110 comprises a first un-doped semiconductor layer 111 and a second un-doped semiconductor layer 112, wherein it may be formed of an un-doped GaN based semiconductor or an unintentionally doped GaN based semiconductor.

The first un-doped semiconductor layer 111 is formed on the substrate 101, and the second un-doped semiconductor layer 112 is formed on the first un-doped semiconductor layer 111. The first and second un-doped semiconductor layers 111 and 112 may be formed of the same semiconductor material, for example, a GaN based semiconductor, but it is not limited thereto.

A plurality of structure holes 115A are formed in the inner side of the first un-doped semiconductor layer 111 at a predetermined depth. The structure holes 115A are formed at the upper portion of the inner side of the first un-doped semiconductor layer 111, having a three-dimensional shape, wherein the shape may have a pillar shape, a horn shape, or hemisphere shape. The pillar shape may comprises a circular pillar shape, a polygonal pillar shape, and an elliptical pillar shape, and the horn shape may comprises a reverse circular truncated cone shape, a reverse frustum of pyramid shape, a reverse cone shape, and a reverse pyramid shape, but such shapes may be changed within the technical scope of the embodiment.

When a convex and concave pattern is formed on the substrate 101, the structure holes 115A may be disposed on the positions corresponding to between a plurality of convex pattern (or a concave patterns), that is, crossing each other, but they are not limited thereto.

The plurality of structure holes 115A may be formed in a matrix shape having a predetermined interval, wherein such an interval may be changed according to current diffusion efficiency but it is not limited thereto. The size of the structure holes 115A may be identical or different, but it is not limited thereto.

A plurality of diffusion semiconductor structures 115 are formed inside the un-doped semiconductor layer 110. The plurality of diffusion semiconductor structures 115 are disposed in the structure holes 115A of the first un-doped semiconductor layer 111, under the second un-doped semiconductor layer 112.

The diffusion semiconductor structure 115 may be selected from an III-V group compound semiconductor doped with a first conductive type dopant, for example, GaN, AlN, AlGaN, InGaN, InN, InAlGaN, AlInN, AlGaAs, GaP, GaAs, GaAsP, AlGaInP, etc. The first conductive type dopant, which is an N type dopant, comprises Si, Ge, Sn, Se, and Te.

The diffusion semiconductor structure 115 is formed in a three-dimensional shape, wherein the shape may have a pillar shape, a horn shape, or hemisphere shape. The pillar shape may comprises a circular pillar shape, a polygonal pillar shape, and an elliptical pillar shape, and the horn shape may comprises a reverse circular truncated cone shape, a reverse frustum of pyramid shape, a reverse cone shape, and a reverse pyramid shape, but such shapes may be changed within the technical scope of the embodiment.

Also, the circumference surface of the diffusion semiconductor structure 115 may be formed in a convex and concave shape to have a maximum surface area, wherein the convex and concave shape may be formed so that the convex shape and the concave shape are alternately formed in the growth direction (or in the vertical direction).

The plurality of diffusion semiconductor structures 115 may be formed in a matrix shape, having a predetermined interval.

The diffusion semiconductor structure 115 may be operated as a semiconductor doped with a high concentration, a high conductor, and a low resistor compared to the first and second un-doped semiconductor layers 111 and 112.

Herein, the diffusion semiconductor structure 115 may be formed having the first conductive type dopant with doping concentration of $5$~$9\times10^{18}$ cm$^{-3}$ or more. The first and second un-doped semiconductor layers 111 and 112 may be formed having the dopant concentration of $1$~$4\times10^{16}$ cm$^{-3}$ or less. Therefore, the diffusion semiconductor structure 115 may be operated as a semiconductor having a high concentration, a low resistor, and a high conductor compared to the un-doped semiconductor layer 110 inside the un-doped semiconductor layer 110.

The un-doped semiconductor layer 110 may be formed at a thickness of about 3 to 5 um, the diffusion semiconductor structure 115 may be formed at a thickness (that is, height) of about 2 to 3 um, and the second un-doped semiconductor layer 112 may be formed at a thickness of about 1 um.

A first conductive type semiconductor layer 120 is formed on the un-doped semiconductor layer 110, wherein the first conductive type semiconductor layer 120 may function as a first electrode contact layer.

The first conductive type semiconductor layer 120 may be selected from an III-V group compound semiconductor doped with a first conductive dopant, for example, GaN, AlN, AlGaN, InGaN, InN, InAlGaN, AlInN, AlGaAs, GaP, GaAs, GaAsP, AlGaInP, etc. When the first conductive type is an N type semiconductor layer, the first conductive type dopant comprises an N type dopant such as Si, Ge, Sn, Se, Te, etc. The first conductive type semiconductor layer 120 may be formed in a single layer or in a multi layer, but it is not limited thereto.

The active layer 130 is formed on the first conductive type semiconductor layer 120, wherein the active layer 130 may be formed having a single quantum well structure or a multi quantum well structure. The active layer 130 may be formed having a period of a well layer and a barrier layer using the III-V group compound semiconductor material, for example, having a period of InGaN well layer/GaN barrier layer. Such an active layer 130 may have semiconductor material different according to light emitting wavelength, but it is not limited thereto.

A conductive clad layer may be formed on and/or under the active layer 130, wherein the conductive clad layer may be formed of AlGaN based semiconductor.

The second conductive type semiconductor layer 140 is formed on the active layer 130, wherein the second conductive type semiconductor layer 140 may be selected from the III-V group compound semiconductor doped with a second conductive type dopant, for example, GaN, AlN, AlGaN, InGaN, InN, InAlGaN, AlInN, AlGaAs, GaP, GaAs, GaAsP, AlGaInP, etc. When the second conductive type is a P type semiconductor layer, the second conductive type dopant comprises a P type dopant such as Mg, Ze, etc. The second conductive type semiconductor layer 140 may be formed in a single layer or in a multi layer, but it is not limited thereto.

The first conductive type semiconductor layer 120, the active layer 130, and the second conductive type semiconductor layer 140 may be defined as light emitting structures.

Herein, a third conductive type semiconductor layer, for example, an N type semiconductor layer or a P type semiconductor layer, may be formed on the second conductive type semiconductor layer 140. Also, the first conductive type semiconductor layer 120 may be implemented as a P type semiconductor layer, and the second conductive type semiconductor layer 140 may be implemented as an N type semiconductor. Therefore, the light emitting structures may comprise at least any one of an N-P junction structure, a P-N junction structure, an N-P-N junction structure, and a P-N-P junction structure.

A first electrode 151 may be formed on the first conductive type semiconductor 120, and a second electrode 153 may be formed on the second conductive type semiconductor layer 140.

Herein, an electrode layer may be formed in a layer shape or in a plural pattern shape on the top surface of the second conductive type semiconductor layer 153 or the third conductive type semiconductor layer for current diffusion. The electrode layer may be formed in a transparent electrode layer or a reflective electrode layer. The transparent electrode layer may comprises at least one of indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IrOx, RuOx, RuOx/ITO, Ni/IrOx/Au, Ni/IrOx/Au/ITO, etc.

The reflective electrode layer may be formed from Ag, Ni, Al, Rh, Pd, Ir, Ru, Mg, Zn, Pt, Au, Hf, and material consisting of a selective combination thereof.

Referring to FIG. 2, if an un-doped semiconductor layer 110 grows on the substrate 101, a dislocation is generated inside the un-doped semiconductor layer 110 due to a lattice mismatch, etc. and the dislocation continuously exists up to the semiconductor layers 120, 130, and 140 on the un-doped semiconductor layer 110. Such a dislocation may exist as fine defects that independently exist in an atom unit or a bundle of dislocation P that collectively exist.

The bundle of dislocation P may be a moving path of current. For example, if electrostatic discharge (ESD) is applied to the semiconductor light emitting device 100, current flows through the bundle of dislocation P for a short time, and if the ESD is not diffused, the semiconductor is melted to form physical holes, causing a problem that the device cannot operate.

In the embodiment, the current flowing through the bundle of dislocation P passes through the un-doped semiconductor layer 110, and the current flowing onto the un-doped semiconductor layer 110 is diffused through the diffusion semiconductor structures 115 therein. In other words, the current flowing through the bundle of dislocation P can be diffused to every area in the vertical direction and in the horizontal direction by the diffusion semiconductor structures 115 with a three-dimensional shape in the un-doped semiconductor layer 110. Thereby, the diffusion semiconductor structures 115 are provided in the un-doped semiconductor layer 110, making it possible to provide a semiconductor device with reinforced ESD immunity and to improve reliability.

Also, the diffusion semiconductor structures 115 can reinforce the ESD immunity, without deterioration in the voltage of the semiconductor light emitting device and the property of light intensity.

FIGS. 3 to 9 are diagrams showing a manufacturing process of the semiconductor light emitting device.

Figure 3:
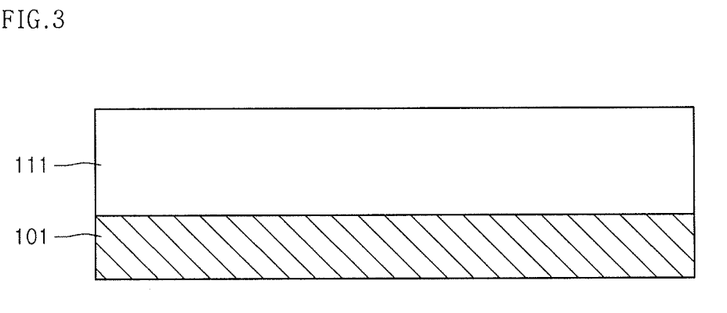
FIGS. 3 to 9 are diagrams showing a manufacturing process of the semiconductor light emitting device of FIG. 1.
Figure 4:
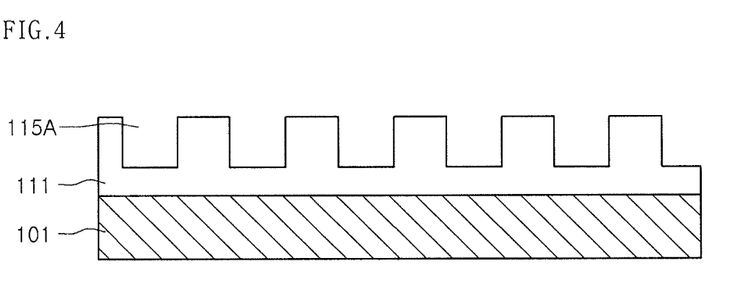

Referring to FIGS. 3 and 4, a substrate 101 is loaded into growth equipment, and II to VI compound semiconductors selectively grow on the substrate 101.

The growth equipment may be formed by an electron beam evaporator, a physical vapor deposition (PVD), a chemical vapor deposition (CVD), a plasma laser deposition (PLD), a dual-type thermal evaporator, a sputtering, and a metal organic chemical vapor deposition (MOCVD), etc., but it is not limited thereto.

The substrate 101 may be selected from sapphire substrate ($Al_2O_3$), SiC, Si, GaAs, GaN, ZnO, Si, GaP, InP, Ge, and a conductive substrate. A convex pattern may be formed on and/or under the substrate 101, wherein the convex pattern may comprises any one of a stripe shape, a lens shape, a pillar shape, a prism shape, and a cone shape.

A convex and concave pattern may be formed on and/or under the substrate 101. The convex pattern shape may comprise any one of a stripe shape, a lens shape, a pillar shape, and a cone figuration.

A II to VI group compound semiconductor (e.g.: ZnO) may be formed on the substrate 101 in a layer or in a plural pattern.

A buffer layer (not shown) may be formed on the substrate 101, wherein the buffer layer may be formed using III-V group compound semiconductors, for example, being able to be selected from GaN, AlN, AlGaN, InGaN, InN, InAlGaN, AlInN, AlGaAs, GaP, GaAs, GaAsP, AlGaInP, etc. The buffer layer may relieve the mismatch of the lattice constant between the substrate 101 and a nitride semiconductor.

A first un-doped semiconductor layer 111 is formed on the substrate 101 or the buffer layer. The first un-doped semiconductor layer 111 may be formed of an un-doped GaN based semiconductor layer or an unintentionally GaN based semiconductor.

The first un-doped semiconductor layer 111 may be formed of the GaN based semiconductor undoped with the conductive dopant by supplying gas including $NH_3$ and TMGa (or TEGa), but such a manufacturing process may be changed within the technical scope of the embodiment.

A plurality of structure holes 115A are formed in the inner side of the first un-doped semiconductor layer 111 at a predetermined depth. The structure holes 115A may be formed at a predetermined depth by performing a wet and/or dry etching process on the top surface of the first un-doped semiconductor layer 111.

The structure holes 115A may be disposed on the positions corresponding to between a plurality of concave patterns, that is, crossing each other, but they are not limited thereto.

Figure 5:
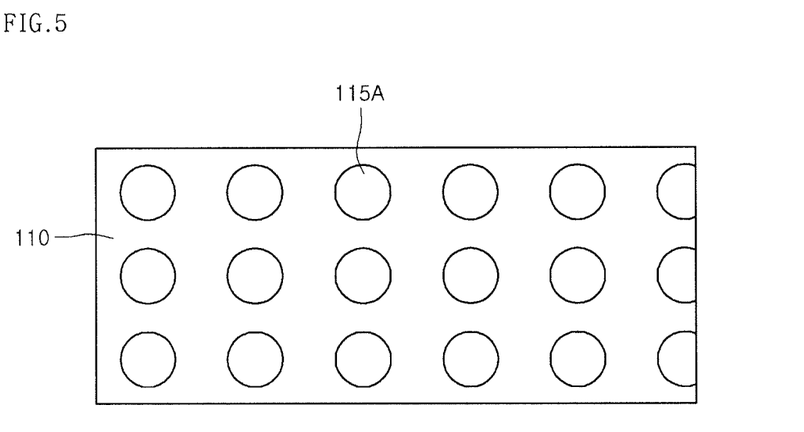

FIG. 5 is a plan view of FIG. 4. Referring to FIGS. 4 and 5, the structure holes 115A are formed in a three-dimensional shape, wherein the shape may have a pillar shape, a horn shape, or hemisphere shape. The pillar shape may comprises a circular pillar shape, a polygonal pillar shape, and an elliptical pillar shape, and the horn shape may comprises a reverse circular truncated cone shape, a reverse frustum of pyramid shape, a reverse cone shape, and a reverse pyramid shape, but such shapes may be changed within the technical scope of the embodiment.

Also, the circumference surface of the diffusion semiconductor structure holes 115A may be formed in a convex and concave shape to have a maximum surface area, wherein the convex and concave shape may be formed so that the convex shape and the concave shape are alternately formed in the growth direction (or in the vertical direction).

The plurality of diffusion semiconductor structure holes 115A may be formed in a matrix shape, having a predetermined interval, wherein such an interval may be changed according to current diffusion efficiency but it is not limited thereto.

The size of the structure holes 115A may be identical or different, but it is not limited thereto.

Figure 6:
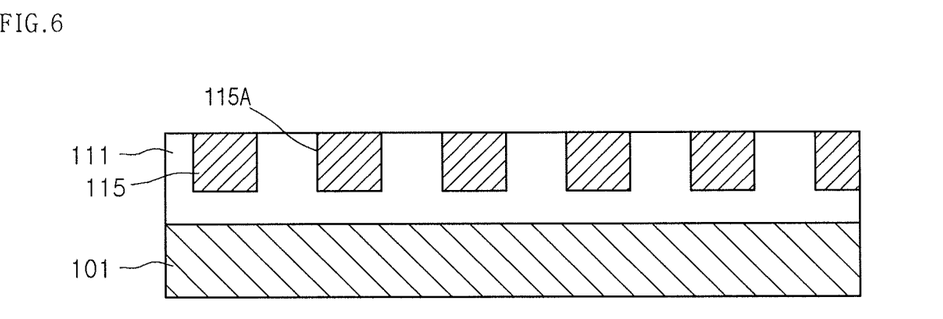

Referring to FIGS. 4 and 6, a plurality of diffusion semiconductor structures 115 are formed in the structure holes 115A of the first un-doped semiconductor layer 111 formed with a mask pattern thereon. The diffusion semiconductor structure 115 may be selected from an III-V group compound semiconductor doped with a first conductive type dopant, for example, GaN, AlN, AlGaN, InGaN, InN, InAlGaN, AlInN, AlGaAs, GaP, GaAs, GaAsP, AlGaInP, etc. The first conductive type dopant, which is an N type dopant, comprises Si, Ge, Sn, Se, and Te.

In the case of an N type GaN, the diffusion semiconductor structure 115 may be formed of the N type GaN by supplying gas including NH$_3$, TMGa (or TEGa), and an N type dopant (Si), but such a manufacturing process may be changed within the technical scope of the embodiment.

The diffusion semiconductor structure 115 may have a thickness identical to or different from the depth of the structure hole 115A of the first un-doped semiconductor layer 111, but it is not limited thereto. The diffusion semiconductor structure 115 is formed in a three-dimensional shape, wherein the shape may have a pillar shape, a horn shape, or hemisphere shape. The pillar shape may comprises a circular pillar shape, a polygonal pillar shape, and an elliptical pillar shape, and the horn shape may comprises a reverse circular truncated cone shape, a reverse frustum of pyramid shape, a reverse cone shape, and a reverse pyramid shape, but such shapes may be changed within the technical scope of the embodiment.

The plurality of diffusion semiconductor structures 115 may be formed in a matrix shape, having a predetermined interval, by the structure holes 115A of the first un-doped semiconductor layer 111.

The diffusion semiconductor structure 115 may act as a semiconductor having a high concentration, a high conductor, and a low resistor compared to the first un-doped semiconductor layer 111.

Figure 7:
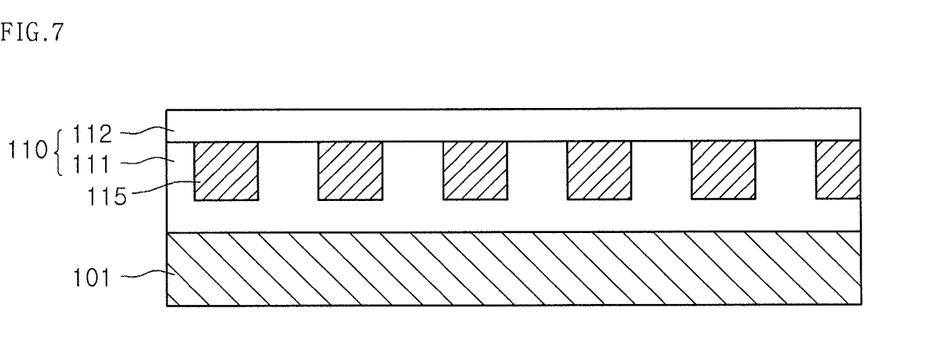

Referring to FIGS. 6 and 7, a second un-doped semiconductor layer 112 is formed on the first un-doped semiconductor layer 111 and the diffusion semiconductor structures 115. The second un-doped semiconductor layer 112 may be formed of the same undoped or unintentionally doped GaN based semiconductor as the first un-doped semiconductor layer 111. The growth condition of the second un-doped semiconductor layer 112 will refer to the first un-doped semiconductor layer 112, but it is not limited thereto.

Herein, the diffusion semiconductor structure 115 is formed as a semiconductor doped with a high concentration, a high conductor, and a low resistor compared to the second un-doped semiconductor layer 112.

Herein, the diffusion semiconductor structure 115 may be formed having the first conductive type dopant with doping concentration of 5~9×10$^{18}$ cm$^{-3}$ or more. The first and second un-doped semiconductor layers 111 and 112 may be formed having the dopant concentration of 1~4×10$^{16}$ cm$^{-3}$ or less. Therefore, the diffusion semiconductor structure 115 may act as a semiconductor having a high concentration, a low resistor, and a high conductor compared to the un-doped semiconductor layer 110 inside the un-doped semiconductor layer 110.

The un-doped semiconductor layer 110 may be formed at a thickness of about 3 to 5 um, the diffusion structure 115 may be formed at a thickness (that is, height) of about 2 to 3 um, and the second un-doped semiconductor layer 112 may be formed at a thickness of about 1 um.

Figure 8:
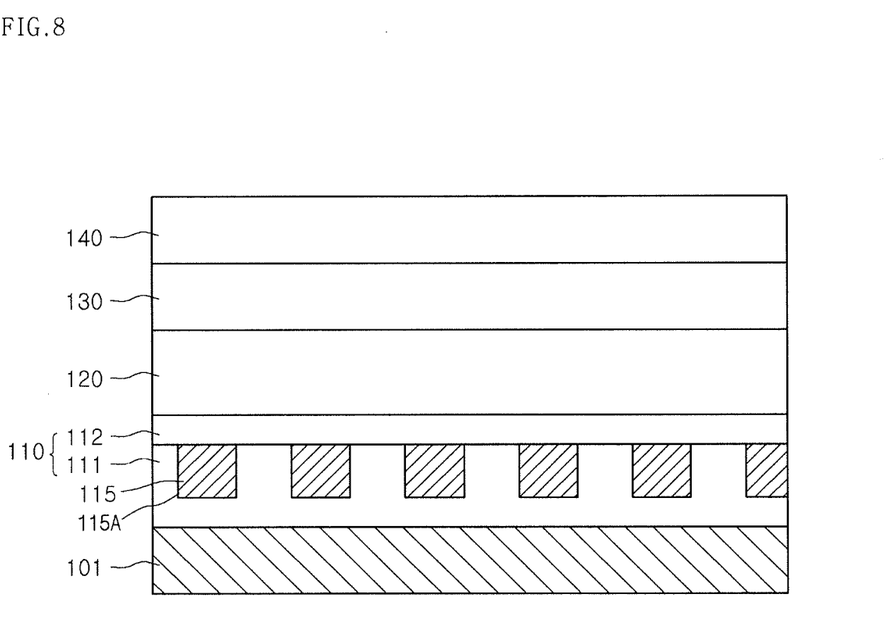

Referring to FIGS. 7 and 8, a first conductive type semiconductor layer 120 is formed on the second un-doped semiconductor layer 112, wherein the first conductive type semiconductor layer 120 may function as a first electrode contact layer.

The first conductive type semiconductor layer 120 may be selected from an III-V group compound semiconductor doped with a first conductive type dopant, for example, GaN, AlN, AlGaN, InGaN, InN, InAlGaN, AlInN, AlGaAs, GaP, GaAs, GaAsP, AlGaInP, etc. When the first conductive type is an N type semiconductor layer, the first conductive type dopant comprises an N type dopant such as Si, Ge, Sn, Se, Te, etc.

The first conductive type semiconductor layer 120 may be formed in a single layer or in a multi layer, but it is not limited thereto.

The active layer 130 is formed on the first conductive type semiconductor layer 120, wherein the active layer 130 may be formed having a single quantum well structure or a multi quantum well structure. The active layer 130 may be formed having a period of a well layer and a barrier layer using the III-V group compound semiconductor material, for example, having a period of InGaN well layer/GaN barrier layer. Such an active layer 130 may have semiconductor material different according to light emitting wavelength, but it is not limited thereto.

A conductive clad layer may be formed on and/or under the active layer 130, wherein the conductive clad layer may be formed of AlGaN based semiconductor.

The second conductive type semiconductor layer 140 is formed on the active layer 130, wherein the second conductive type semiconductor layer 140 may be selected from the III-V group compound semiconductor doped with a second conductive type dopant, for example, GaN, AlN, AlGaN, InGaN, InN, InAlGaN, AlInN, AlGaAs, GaP, GaAs, GaAsP, AlGaInP, etc. When the second conductive type is a P type semiconductor layer, the second conductive type dopant comprises a P type dopant such as Mg, Ze, etc. The second conductive type semiconductor layer 140 may be formed in a single layer or in a multi layer, but it is not limited thereto.

The first conductive type semiconductor layer 120, the active layer 130, and the second conductive type semiconductor layer 140 may be defined as light emitting structures.

Herein, a third conductive type semiconductor layer, for example, an N type semiconductor layer or a P type semiconductor layer, may be formed on the second conductive type semiconductor layer 140. Also, the first conductive type semiconductor layer 120 may be implemented as a P type semiconductor layer, and the second conductive type semiconductor layer 140 may be implemented as an N type semiconductor. Therefore, the light emitting structures may comprise at least any one of an N-P junction structure, a P-N junction structure, an N-P-N junction structure, and a P-N-P junction structure.

If the plurality of compound semiconductor layers 110, 120, 130, and 140 are formed on the substrate 101, they can be manufactured as a horizontal semiconductor light emitting device or a vertical semiconductor light emitting device through a mesa etching process and an electrode forming process.

Figure 9:
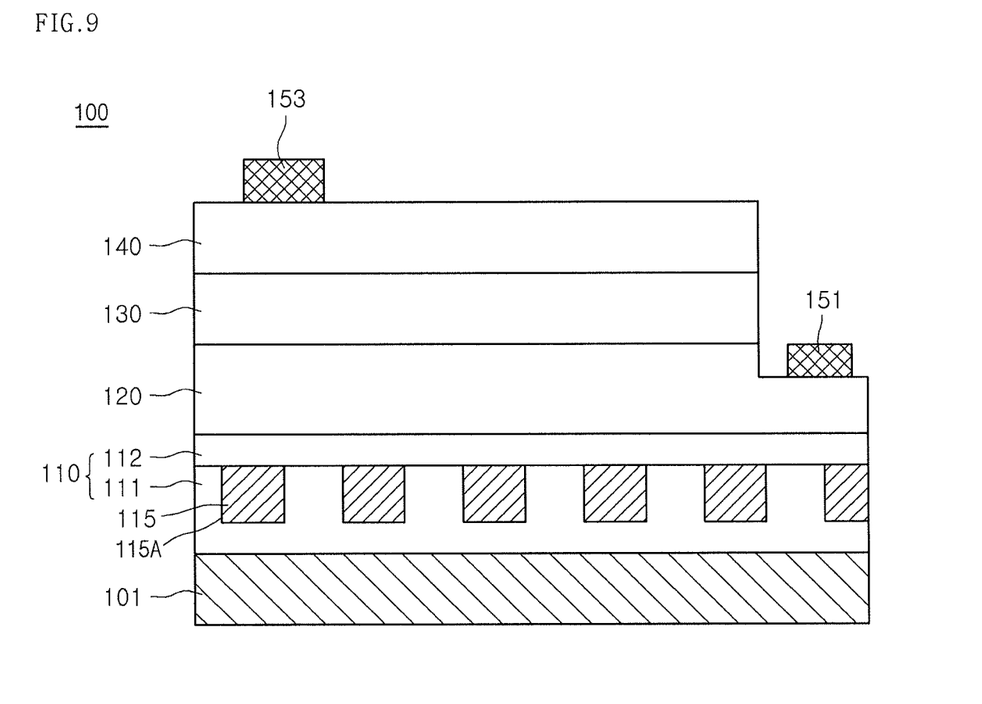

FIG. 9 is a side cross-sectional view showing a horizontal semiconductor light emitting device using FIG. 8.

Referring to FIGS. 8 and 9, a portion of the first conductive type semiconductor layer 120 is exposed by performing a mesa etching process.

A first electrode 151 may be formed on the first conductive type semiconductor layer 120, and a second electrode 153 may be formed on the second conductive type semiconductor layer 140.

Herein, an electrode layer forming process may be processed before or after the mesa etching is performed. The electrode layer may be formed on the tope surface of the second conductive type semiconductor layer 140 or the third conductive type semiconductor layer in a layer shape or in a plural pattern shape. The electrode layer may be formed in a transparent electrode layer or a reflective electrode layer. The transparent electrode layer may comprises at least one of indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IrOx, RuOx, RuOx/ITO, Ni/IrOx/Au, Ni/IrOx/Au/ITO, etc. The reflective electrode layer may be formed from Ag, Ni, Al, Rh, Pd, Ir, Ru, Mg, Zn, Pt, Au, Hf, and material consisting of a selective combination thereof.

Referring to FIGS. 2 and 9, a dislocation is generated from a semiconductor layer that grows on the substrate, for example, the un-doped semiconductor layer 110, due to a lattice mismatch, and the dislocation continuously exists up to the semiconductor layers 120, 130, and 140 on the un-doped semiconductor layer 110. Such a dislocation may exist as fine defects that independently exist in an atom unit or a bundle of dislocation (P in FIG. 2) that collectively exist. Electrostatic discharge (ESD) may be applied to the semiconductor light emitting device 100 in which such a dislocation exists and if the ESD is applied, current flows through the bundle of dislocation (P in FIG. 2) for a short time.

The current flowing through the bundle of dislocation P passes through the un-doped semiconductor layer 110, and the current flowing onto the un-doped semiconductor layer 110 is diffused through the diffusion semiconductor structures 115 in a three-dimensional shape therein. In other words, the current flowing through the bundle of dislocation P is diffused to every area in the vertical direction and in the horizontal direction by the un-doped semiconductor layer 110 and the diffusion semiconductor structures 115. Thereby, the diffusion semiconductor structures 115 are provided inside the un-doped semiconductor layer 110, making it possible to provide a semiconductor device with reinforced ESD immunity and to improve electrical reliability.

Meanwhile, a manufacturing process of a vertical semiconductor light emitting device using FIG. 8 will be described. A reflective electrode layer (not shown) and a conductive supporting member (not shown) are formed on the second conductive type semiconductor layer 140 in sequence. After the conductive supporting member is positioned as a base, the substrate 101 is removed. Therefore, if the un-doped semiconductor layer 110 is exposed, an etching is partially performed at a depth to the extent that the bottom surface of the first conductive type semiconductor layer 120 is exposed, thereby making it possible to form a first electrode.

Embodiments can provide the light emitting device with reinforced ESD immunity by the three-dimensional current diffusion, and can reinforce the ESD immunity without deterioration in the voltage and the property of light intensity, etc.

Embodiments can improve the electrical and optical efficiency of the semiconductor light emitting device, and can improve the electrical reliability.

Any reference in this specification to "one embodiment," "an embodiment, example embodiment," etc, means that a particular feature, structure, or characteristic described in connection with the embodiment is comprised in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A semiconductor light emitting device, comprising:
   a first conductive type semiconductor layer;
   a second conductive type semiconductor layer disposed on a top surface of the first conductive type semiconductor layer;
   an active layer disposed between the first conductive type semiconductor layer and the second conductive type semiconductor layer;
   a first un-doped semiconductor layer under a bottom surface of the first conductive type semiconductor layer;
   a second un-doped semiconductor layer disposed between the first conductive type semiconductor layer and the first un-doped semiconductor layer; and
   a diffusion semiconductor structure comprising a first diffusion semiconductor structure and a second diffusion semiconductor structure in the first un-doped semiconductor layer,
   wherein the first diffusion semiconductor structure is spaced from the second diffusion semiconductor structure,
   wherein a first portion of the first un-doped semiconductor layer is disposed between a bottom surface of the diffusion semiconductor structure and a bottom surface of the first un-doped semiconductor layer,
   wherein a second portion of the first un-doped semiconductor layer is connected with the first portion of the first un-doped semiconductor layer and is disposed between the first diffusion semiconductor structure and the second diffusion semiconductor structure,
   wherein a top surface of the diffusion semiconductor structure and a top surface of the second portion of the first un-doped semiconductor layer are in contact with a bottom surface of the second un-doped semiconductor layer, and
   wherein the first un-doped semiconductor layer is formed of a single layer having the first and second portions.

2. The semiconductor light emitting device according to claim 1, wherein the diffusion semiconductor structure comprises a III-V group compound semiconductor comprising a first conductive type dopant with a high concentration compared to the first and second un-doped semiconductor layers.

3. The semiconductor light emitting device according to claim 1, wherein the diffusion semiconductor structure comprises at least one of a three-dimensional structure shape, a pillar shape, and a horn shape.

4. The semiconductor light emitting device according to claim 2, wherein the first and second un-doped semiconductor layers comprise a GaN based semiconductor, and the diffusion semiconductor structure is arranged with a matrix shape.

5. The semiconductor light emitting device according to claim 2, further comprising:
   at least one of a buffer layer, a substrate of which an upper side is flat, and a substrate of which an upper side has a convex and concave pattern under the first un-doped semiconductor layer.

6. A semiconductor light emitting device, comprising:
   a substrate;
   a first un-doped semiconductor layer on the substrate, wherein a plurality of recessed portions are provided on a top surface of the first un-doped semiconductor layer, wherein each of the plurality of recess portions are spaced from each other by a predetermined gap, and wherein a thickness of the first un-doped semiconductor layer is greater than a thickness of the recessed portions;

a plurality of diffusion semiconductor structures in the recessed portions of the first un-doped semiconductor layer;

a second un-doped semiconductor layer on the top surface of the first un-doped semiconductor layer and a top surface of the plurality of diffusion semiconductor structures; and a light emitting structure comprising a plurality of compound semiconductor layers disposed on a top surface of the second un-doped semiconductor layer, wherein the light emitting structure comprises a first conductive type semiconductor layer, a second conductive type semiconductor layer disposed on a top surface of the first conductive type semiconductor layer, and an active layer disposed between the first conductive type semiconductor layer and the second conductive type semiconductor layer, wherein the first un-doped semiconductor layer is formed of a single layer and has a thickness greater than a thickness of the plurality of diffusion semiconductor structures, and wherein the plurality of diffusion semiconductor structures do not directly contact each other.

7. The semiconductor light emitting device according to claim 6, further comprising:

a convex and concave pattern on the substrate, wherein one of the convex and concave pattern of the substrate and the recessed portions of the first un-doped semiconductor layer are disposed to cross each other.

8. The semiconductor light emitting device according to claim 6, wherein the plurality of diffusion semiconductor structures are III-V group compound semiconductors comprising a first conductive type dopant exceeding the dopant concentration of the first un-doped semiconductor layer and the second un-doped semiconductor layer.

9. The semiconductor light emitting device according to claim 8, wherein the plurality of diffusion semiconductor structures are arranged in a three-dimensional structure shape having a predetermined interval.

10. The semiconductor light emitting device according to claim 8, wherein the first un-doped semiconductor layer and the second un-doped semiconductor layer are a GaN based semiconductor, and the light emitting structure comprises at least one selected from the group consisting of GaN, MN, AlGaN, InGaN, InN, InAlGaN, AlInN, AlGaAs, GaP, GaAs, GaAsP, and AlGaInP.

11. The semiconductor light emitting device according to claim 8, further comprising:

a II to VI group compound semiconductor layer formed between the substrate and the first un-doped semiconductor layer.

12. The semiconductor light emitting device according to claim 8, wherein the recessed portions are in a pillar shape, a hemisphere shape, or a horn shape.

13. The semiconductor light emitting device according to claim 8, wherein the diffusion semiconductor structures are low resistors and/or high conductors against the first and second un-doped semiconductor layers.

14. The semiconductor light emitting device according to claim 8, wherein the plurality of diffusion semiconductor structures are formed having a first conductive type dopant of $5 \times 10^{18}$ cm$^{-3}$~$9 \times 10^{18}$ cm$^{-3}$ or more.

15. The semiconductor light emitting device according to claim 2, further comprising:

at least one of an n type semiconductor layer, a transparent electrode layer, a reflective electrode layer, and a first electrode on the second conductive type semiconductor layer.

16. The semiconductor light emitting device according to claim 1, wherein each of the first and second diffusion semiconductor structures has a thickness greater than a thickness of the second un-doped semiconductor layer and less than a thickness of the first un-doped semiconductor layer.

* * * * *